United States Patent [19]

Kishino et al.

[11] 4,178,593

[45] Dec. 11, 1979

[54] DRIVING CIRCUIT FOR A LUMINESCENT DISPLAY TUBE FOR ANALOG DISPLAY

[75] Inventors: Takao Kishino; Toshio Kamagata, both of Mobara, Japan

[73] Assignee: Futaba Denshi Kogyo K.K., Chiba, Japan

[21] Appl. No.: 842,804

[22] Filed: Oct. 17, 1977

[30] Foreign Application Priority Data

Oct. 15, 1976 [JP] Japan ................................. 51-122951

[51] Int. Cl.$^2$ ........................................... H01J 17/48
[52] U.S. Cl. ..................................... 340/753; 313/517; 340/772; 315/169.4
[58] Field of Search ..................... 340/324 R, 336, 753, 340/754; 315/168, 169 JV, 169 R; 313/217, 517, 519

[56] References Cited

U.S. PATENT DOCUMENTS

| | | | |
|---|---|---|---|
| 3,824,581 | 7/1974 | Ohno | 340/753 |
| 3,922,666 | 11/1975 | Inami et al. | 315/169 R |
| 4,040,719 | 8/1977 | Schiebelhuth | 340/336 |
| 4,041,348 | 8/1977 | Eto et al. | 313/517 |

Primary Examiner—David L. Trafton
Attorney, Agent, or Firm—Oblon, Fisher, Spivak, McClelland & Maier

[57] ABSTRACT

A driving circuit for a luminescent display tube having a plurality of segment anodes arranged in a predetermined direction and each provided with a luminescent material layer, the segment anodes being divided into a plurality of groups each having the same number of the segment anodes, the corresponding segment anodes of the respective groups being connected in common, and a plurality of control grids provided separately for the respective groups, comprising a scanning pulse generating circuit section for generating scanning pulses for successively driving the segment anodes connected in common, and a control circuit section adapted to receive the scanning pulses from the scanning pulse generating circuit section and input numeric signals and adapted to give driving signals to the control grids according to the input numeric signals.

5 Claims, 5 Drawing Figures

DRIVING CIRCUIT FOR A LUMINESCENT DISPLAY TUBE FOR ANALOG DISPLAY

BACKGROUND OF THE INVENTION

1. Field of the Invention

The present invention relates to a driving circuit for an analog luminescent display tube which analogously displays numerical information digitally given.

2. Description of the Prior Art

In order to represent or display information concerning quantity, position and the like, analog representation or display is adopted in many cases because analog representation has advantages in that it can easily grasp the ratio of a quantity to the whole or the position in question.

For the purpose of performing the above-mentioned analog representation or display, various types of devices have been heretofore developed and put into practical use. In recent years, a luminescent display tube for analog display (hereinafter referred to as luminescent display tube) has been put into practical use, which uses luminescent material capable of luminescing when bombarded with electrons.

The luminescent display tube utilizing the luminescence of luminescent material has a substrate or base plate, a plurality of segment anodes arranged on the base plate, for instance, rectilinearly and each coated with a luminescent material layer, a mesh-like control grid provided near and above the segment anodes, and a filament cathode or cathodes provided above the control grid (hereinafter referred to as grid) and adapted to emit thermions when heated. In this luminescent display tube, anode voltage is given to the segment anodes corresponding in number to the input information to be displayed, and thereby the segment anodes are made to luminesce and accordingly the input information is displayed in the form of a luminescent bar-shaped pattern. Thus, analog representation can be performed.

The luminescent display tube of this type provides high-quality color of luminescence and therefore can be used in a dark environment such as at night; in addition, it has no moving parts, and therefore is free of malfunctions caused by mechanical vibrations and can be operated at high response speed.

In order to drive the above-mentioned luminescent display tube for use in analog display, the following driving circuits are usually adopted.

In an example of the driving circuit, a plurality of segment anodes each coated with a luminescent material layer are connected independently of each other to external terminals through which anode voltage is given to the segment anodes corresponding in number to the input information to perform static analog display.

According to the above driving circuit, it is possible to make the segment anodes luminesce by a relatively low anode voltage. However, it has disadvantages in that the increase of the number of segment anodes for the purpose of increasing the amount of display or improving the reading accuracy will cause the increase of the number of external terminals and that of the number of driving circuits which give driving voltage to the segment anodes.

In another example of the driving circuit, a number of segment anodes arranged rectilinearly and each covered with a luminescent material layer are grouped into a plurality of groups each having the same number of segment anodes; the corresponding segment anodes of the respective groups are connected in common to the external terminals, respectively; and a plurality of grids are provided for the respective groups independently of one another, being connected to the external terminals separately. The above grids are scanned in regular succession and in a time-sharing manner, and the segment anodes are given driving voltage in synchronization with the scanning signal for the grids according to the input information so that display may be performed.

According to the above driving circuit, the number of the external terminals becomes the sum of the number of the segment anodes of each group and that of the grids provided for the respective groups. Therefore, even when the number of segment anodes of each group or that of the groups is increased, the increase of the number of external terminals can be minimized; accordingly, fine display can be performed with a small number of external terminals.

In the latter example of the driving circuit, however, the increase of the number of groups results in the decrease of the duty factor of each segment anode, i.e., the ratio of the duration of luminescence of each segment to the scanning period of the grid. Therefore, the driving voltage given to the segment anode must be kept high in order to obtain desired luminance.

SUMMARY OF THE INVENTION

The present invention contemplates to eliminate the above-mentioned disadvantages of the prior art.

Therefore, it is the main object of the present invention to provide a driving circuit for a luminescent display tube for analog display, which can decrease the number of the external terminals led out of the luminescent display tube, which can increase the duty factor of each segment anode, and which makes it possible to perform low-voltage driving.

According to the present invention, there is provided a driving circuit for a luminescent display tube for analog display, the luminescent display tube having a plurality of segment anodes arranged in a predetermined direction and each provided with a luminescent material layer adapted to luminesce when bombarded with thermions, the segment anodes being divided into a plurality of groups each having the same number of the segment anodes, the corresponding segment anodes of the respective groups being connected in common, and a plurality of control grids provided separately for the respective groups, comprising at least a scanning pulse generating circuit section for generating scanning pulses for successively driving the above segment anodes connected in common, and a control circuit section adapted to receive the scanning pulses from the scanning pulse generating circuit section and input numeric signals and adapted to give driving signals to the control grids provided for the respective groups, according to the input numeric signals.

DESCRIPTION OF THE PREFERRED EMBODIMENTS

Now the preferred embodiments of the present invention will be hereinafter described with reference to the accompanying drawings.

Figure 1:
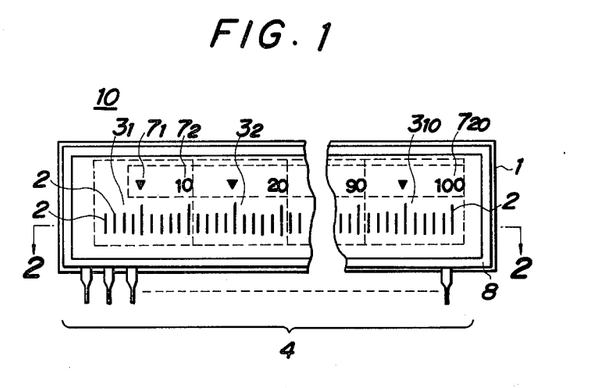
FIG. 1 is a fragmentary external view of an example of the luminescent display tube for analog display driven by the driving circuit according to the present invention.
Figure 2:
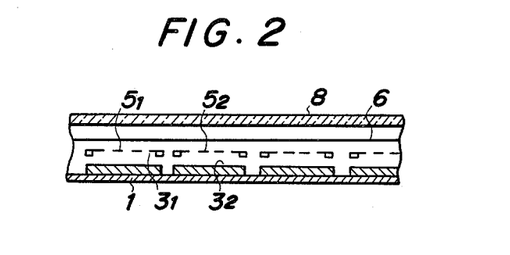
FIG. 2 is a sectional view taken along the line 2—2 of FIG. 1.

Reference is now made to FIGS. 1 and 2 which show an example of the luminescent display tube 10 operated or driven by the driving circuit of the present invention. FIG. 1 is an external view of the luminescent display tube 10, and FIG. 2 is a fragmentary sectional view taken along the line 2—2 of FIG. 1.

Reference numeral 1 designates a base plate or substrate made of insulating material such as glass or ceramics. On the base plate, there are provided a luminescent layer and a plurality of segment anodes 2 the number of which is determined by the unit and amount of display. The segment anodes 2 are grouped into a plurality of groups $3(3_1, 3_2, \ldots)$ each of which contains the same number of segment anodes. The corresponding segment anodes 2 of the groups 3 are connected in common to external terminals 4, respectively. In the example shown in FIG. 1, the distance between the segments 2 corresponds to the "unity" or numerical value "1" of the input information and each group 3 consists of 10 segment anodes 2.

Above and in the vicinity of the groups $3(3_1, 3_2, \ldots)$, there is provided grids $5(5_1, 5_2, \ldots)$ electrically independent of each other, respectively. Each of these grids 5 is connected to the corresponding external terminal 4. At least one filament cathode 6 adapted to emit thermions when heated, is provided above the grids 4 for all the groups 3 in common, being connected to the corresponding external terminal 4.

In order to facilitate reading of the information amount displayed, if necessary, numerical read sections $7(7_1, 7_2, \ldots)$ consisting of numerical characters, marks or the like and covered with luminescent material layers may be provided in the vicinity of the last segment anodes of the respective groups 3, being electrically connected in common to the corresponding terminal.

Reference numeral 8 designates a transparent front cover adapted to keep the inside at high vacuum and through which the external terminals are airtightly penetrated. The front cover 8 is bonded to the base plate 1 along the peripheral edge thereof to form the casing of the luminescent display tube 10.

Now a preferred embodiment of the driving circuit of the present invention for driving the luminescent display tube having the above-mentioned construction will be hereinafter described with reference to FIG. 3 which is the entire diagram of the luminescent display tube driving circuit according to the present invention.

Reference numeral 11 designates a scanning pulse generating circuit section for supplying scanning pulses to output terminals $t_1, t_2, \ldots, t_{11}$, which scanning pulses scan the segment anodes 2 and numeric read section 7 cyclically and in regular succession on the basis of predetermined-period clock pulses generated either externally or internally. Reference numeral 12 designates a segment anode driving section having a plurality of driving circuits $DR_1, DR_2, \ldots, DR_{11}$ for separately amplifying the scanning pulses outputted from the respective output terminals $t_1, t_2, \ldots, t_{11}$ of the scanning pulse generating section 11. The output of the segment anode driving section 12 is given, as driving signals, to the segment anodes 2 and numeric read sections 7 of the luminescent display tube 10 in which as mentioned above the corresponding anodes 2 of the respective groups $3(3_1, 3_2, \ldots)$ are electrically connected to each other in common.

Reference numeral 13 designates a first decoder funtioning as a converter circuit to which, for instance, a numeric signal input for the least significant digit is given from among numeric signal inputs given in the form of the binary coded decimal code and in which a decimal digit signal is supplied to either one of the output terminals $2_{21}, t_{22}, \ldots, t_{29}$ by converting the above numeric signal input. If, for instance, the inputted numeric value is "1", a signal "1" will be given to the output terminal $t_{21}$; and if, for instance, the inputted numeric value is "2", a signal "1" will be given to the output terminal $t_{22}$.

Reference numeral 14 designates a scanning pulse selection circuitry having two-input OR-circuits $OR_1$, $OR_2, \ldots, OR_9$, two-input AND-circuits $AND_1, AND_2, \ldots, AND_9$, and a multiple-input OR-circuit $OR_{10}$. The scanning pulse selection circuitry 14 receives scanning pulses outputted from the scanning pulse generating circuit 11 and selects and synthesize the scanning pulses corresponding in number to the numeric value given to the first decoder 13.

Reference numeral 15 designates a second decoder functioning as a converter circuit to which, for instance, a numeric signal input for one of the digits except the least significant digit is given from among numeric signal inputs given in the form of the binary-coded decimal code and in which a decimal digit signal is supplied to one of the output terminals $t_{30}, t_{31}, \ldots, t_{39}$ by converting the above numeric signal input. If, for instance, the inputted numeric signal contains only the numeric values for the least significant digit, a signal "1" is given to the output terminal $t_{30}$; if, for instance, the numeric value is "1" for a higher-position digit, a signal "1" will be given to the output terminal $t_{31}$; and if, for instance, the numeric value is "2" for a higher-position digit, a signal "1" will be given to the output terminal $t_{32}$.

Reference numeral 16 designates a grid-signal generating circuit section having two-input AND-circuits $AND_{11}, AND_{12}, \ldots, AND_{20}$ and three-input OR-circuits $OR_{11}, OR_{12}, \ldots, OR_{20}$. The grid-signal generating circuit section 16 produces a grid signal on the basis of the signals outputted from the scanning pulse selection circuitry 14 and second decoder 15. Thus, the decoders 13 and 15, the scanning pulse selection circuitry 14 and the grid-signal generating circuitry 16 collectively form a control circuit section for giving driving signals to the grids $5(5_1, 5_2, \ldots)$ of the luminescent display tube 10.

Reference numeral 17 designates a grid driving section for separately amplifying signals outputted from the grid-signal generating circuitry 16 and giving the amplified signals to the grids $5(5_1, 5_2, \ldots)$ as grid-driving voltage. The grid driving section 17 is composed of a plurality of driving circuits $DR_{21}, DR_{22}, \ldots, DR_{30}$.

Figure 4:
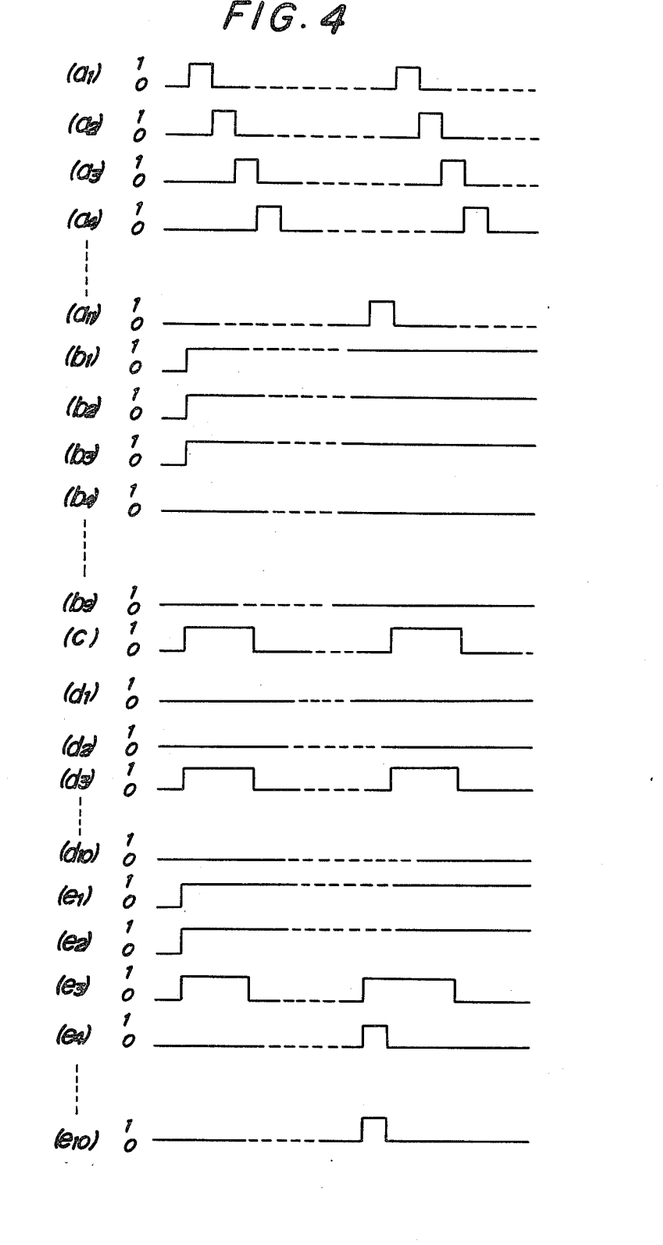
FIG. 4 is a timing chart for explaining the operation of the preferred embodiment shown in FIG. 3.

The driving circuit constructed as above according to the present invention may be operated as follows:

The scanning pulse generating circuit section 11 puts out, at the output terminals $t_1, t_2, \ldots, t_{11}$, such scanning pulses as shown in FIG. 4($a_1$) to 4($a_{11}$) cyclically and in regular succession according to predetermined-period clock pulses.

Scanning pulses outputted from the output terminals $t_1, t_2, \ldots, t_{11}$ are given to the driving circuits $DR_1, DR_2, \ldots, DR_{11}$ of the segment anode driving section 12, respectively. At the driving circuits $DR_1, DR_2, \ldots, DR_{11}$, the scanning pulses are amplified and thereby given a voltage enough to drive the segment anodes 2 and numeric read sections 7, and then are inputted through the external terminals 4 to the segment anodes 2 and numeric read sections 7 of the luminescent display tube 10 in which the corresponding segment anodes 2 of the respective groups 3 are connected in common. In other words, the scanning pulses scan the corresponding segment anodes 2 of the respective groups $3(3_1, 3_2, \ldots)$ simultaneously and, in the example shown in FIG. 3, at a duty factor of 1/11.

Meanwhile, the scanning pulses outputted from the scanning pulse generating circuit section 11 are fed to the AND-circuits $AND_1, AND_2, \ldots, AND_9$ of the scanning pulse selection circuitry 14 through No. 1 input terminals of the AND-circuits, respectively.

When a numeric signal for the least significant digit of the information input is supplied, the first decoder 13 converts the numeric signal into a decimal signal to give a signal "1" to any one of the output terminals $t_{21}, t_{22}, \ldots, t_{29}$. For instance, when a numeric signal "23" is given as an information input to be displayed, the signal "3" for the least significant digit of the above numeric signal "23" is given to the first decoder 13 where a signal "1" is outputted from the output terminal $t_{23}$ which corresponds to the numeric value "3". The "1" signal outputted from the output terminal $t_{23}$ is put in the OR-circuit $OR_3$ of the scanning pulse selection circuitry 14 to make the output thereof go to "1" as shown in FIG. 4 ($b_3$). The output of the OR-circuit $OR_3$ is put in the OR-circuit $OR_2$, and therefore the output of the OR-circuit $OR_2$ also goes to "1" as shown in FIG. 4($b_2$). In addition, the output of the OR-circuit $OR_1$, in which the output of the OR-circuit $OR_2$ is put, also goes to "1" as shown in FIG. 4 ($b_1$).

In other words, when a numeric signal for the least significant digit of the inputted numeric signal is given to the first decoder 13 and accordingly a signal "1" is outputted from an output terminal corresponding to the numeric value for the least significant digit, a signal "1" comes out of the OR-circuit in which the output terminal corresponding to the numeric signal for the least significant digit is put and out of all the OR-circuits to which connected are output terminals corresponding to numeric values smaller than the above numeric value for the least significant digit, in the scanning pulse selection circuitry 14.

Meanwhile, the outputs of the OR-circuits $OR_1, OR_2, \ldots, OR_9$ are put in No. 2 input terminals of the AND-circuits $AND_1, AND_2, \ldots, AND_9$, respectively. Thus the AND-logic operation is performed in these AND-circuits concerning the signals put in the No. 2 input terminals thereof and the scanning pulses put in the No. 1 input terminals thereof from the scanning pulse generating section 11.

Besides, the outputs of the AND-circuits $AND_1, AND_2, \ldots, AND_9$ are put in the OR-circuit $OR_{10}$ where the OR-logic operation is performed. Accordingly, the scanning pulses outputted from the output terminals $t_1, t_2$ and $t_3$ of the scanning pulse generating circuit section 11 as shown in FIGS. 4($a_1$), and 3($a_2$) and 3($a_3$) are fed to the OR-circuit $OR_{10}$ through the respective AND-circuits $AND_1, AND_2$ and $AND_3$; thus, in the OR-circuit $OR_{10}$, three scanning pulses corresponding in number to the numeric value "3" inputted to the first decoder 13 are selected and synthesized, being outputted from the output terminal of the OR-circuit $OR_{10}$ as shown in FIG. 4(c).

In this case, scanning pulses are outputted from the scanning pulse generating circuit section so that the fall point of a scanning pulse may coincide with the rise point of a scanning pulse subsequent to the above pulse as shown in FIGS. 4($a_1$) to 4($a_{11}$). Therefore, the signal outputted from the OR-circuit $OR_{10}$ take a continuous waveform synthesized from three successive scanning pulses. However, in cases where a blanking time is provided between two successive scanning pulses in order to prevent possible leakage luminescence occurring between adjacent segment anodes 2 of the luminescent display tube 10, the output of the OR-circuit does not take a continuous waveform but takes an intermittent waveform having blanking times. Then, the output of the OR-circuit $OR_{10}$ of the scanning pulse selection circuitry 14 is fed to the AND-circuits $AND_{11}$ to $AND_{20}$ of the grid-signal generating circuitry 16 through No. 1 input terminals thereof connected in common.

Meanwhile, a numeric signal for a higher-position digit of the information input is given to the second decoder 15. As a result, a signal "1" is outputted from any one of the output terminals $t_{30}$ to $t_{39}$ depending upon the numeric signal inputted. If, for instance, the numeric signal inputted is "23" as described above, the numeric signal "2" for the higher-position digit "2" of the above numeric information input "23" is given to the second decoder 15, and a signal "1" is outputted from the output terminal $t_{32}$ corresponding to the numeric value "2" and is given to the AND-circuit $AND_{13}$ of the grid-signal generating circuitry 16 where the AND-logic operation is performed with respect to the above signal and the output of the OR-circuit $OR_{10}$. Thus, the AND-circuit $AND_{13}$ produces the same output signal as the OR-circuit $OR_{10}$ as shown in FIG. 4($d_3$). The output of the AND-circuit $AND_{13}$ is fed to the OR-circuit $OR_{13}$ where a signal "1" is obtained at its output terminal as shown in FIG. 4 ($e_3$). However, the outputs of other AND-circuits $AND_{11}, AND_{12}$, and $AND_{14}$ to $AND_{20}$ go to "0" as shown in FIGS. 4 ($d_1$), 4($d_2$), and 4 ($d_4$) to 4($d_{10}$), since No. 2 input terminals of the above-mentioned other AND-circuits remain at "0".

The signal "1" outputted from the output terminal $t_{32}$ of the second decoder 15 is also given to one of the input terminals of the OR-circuit $OR_{12}$, and therefore a signal "1" is outputted, as shown in FIG. 4 ($e_2$), from the output terminal of the OR-circuit $OR_{12}$. Besides, the output of the OR-circuit $OR_{12}$ is fed also to one of the input terminals of the OR-circuit $OR_{11}$, and therefore a signal "1" is outputted, as shown in FIG. 4 ($e_1$), from the output terminal of the OR-circuit $OR_{11}$. In other words, if a numeric signal "2" for the higher-position digit of the information input is given to the second decoder 15, a signal "1" is outputted from the output terminal $t_{32}$ of the second decoder 15 corresponding to the above numeric value "2" and as a result the AND-circuit $AND_{13}$ corresponding to the above numeric value "2" is opened and therefore the scanning pulses passed through the output of the OR-circuit $OR_{10}$ of the scanning pulse selection circuitry 14 is outputted from the output terminal of the OR-circuit $OR_{13}$. On the other hand, a signal "1" is outputted from the output terminals of the OR-circuits $OR_{12}$ and $OR_{11}$ corresponding to numeric values smaller than the above numeric value "2", when the numeric value "2" is being given to the second decoder 15.

When the scanning pulses shown in FIG. 4 ($a_{11}$) are outputted from the output terminal $t_{11}$ of the scanning pulse generating circuit section 11, these scanning pulses are inputted in one of the input terminals of the OR-circuit $OR_{20}$ of the grid-signal generating circuitry 16 and thereby a signal "1" is outputted from the OR-circuit $OR_{20}$. Meanwhile, one of the input terminals of each of the OR-circuits $OR_{11}$ to $OR_{20}$ is connected to the output of the OR-circuit positioned at the immediate right as shown. Accordingly, if a signal "1" is given to one of the input terminals of the OR-circuit $OR_{20}$, this signal passes through all of the OR-circuits $OR_{20}$ to $OR_{11}$ while giving signals "1" to the respective output terminals of the above OR-circuits as shown in FIGS. 4 ($e_1$) to 4 ($e_{10}$). In other words, if scanning pulses for scanning the numeric read sections 7 of the luminescent display tube 10 are outputted from the output terminal $t_{11}$ of the scanning pulse generating circuit section 11, signals "1" are produced at the output terminals of the OR-circuits $OR_{11}$ to $OR_{20}$ of the grid-signal generating circuitry 16 while synchronizing with the above scanning pulses.

The outputs of the OR-circuits $OR_{11}$ to $OR_{20}$ shown in FIGS. 4 ($e_1$) to 4 ($e_{10}$) are given to the driving circuits $DR_{21}$ to $DR_{30}$ of the grid driving section 17, respectively, where the signals are amplified enough to drive the grids 5 and are given to the respective grids 5 ($5_1$ to $5_{10}$) of the luminescent display tube 10 as grid driving signals.

When the numeric signal "2" for the higher-position digit of the inputted numeric signal "23" is being given to the second decoder 15, grid driving signals of DC level are given, as shown in FIGS. 4 ($e_1$) and 4 ($e_2$), to the grids $5_1$ and $5_2$ corresponding to the first and second groups $3_1$ and $3_2$ of the luminescent display tube 10. Therefore, all the segment anodes 2 which form the groups $3_1$ and $3_2$ are scanned and driven to luminesce by the scanning pulses outputted from the scanning pulse generating circuit section 11 and shown in FIGs. 4 ($a_1$) to 4 ($a_{11}$). On the other hand, when the numeric signal "3" for the least significant digit of the inputted numeric signal "23" is being given to the first decoder 13, three scanning pulses corresponding to the numeric signal "3" shown in FIG. 4 ($e_3$) are given to the grid $5_3$ corresponding to the third group $3_3$ as grid driving signals. Therefore, the three segment anodes forming the third group $3_3$ are driven to luminesce according to the scanning pulses shown in FIGS. 4 ($a_1$) to 4 ($a_3$).

Thus, in the luminescent display tube 10, twenty-three segment anodes 2 corresponding to the inputted numeric signal "23" are driven to luminesce and thereby analog display is performed in a bar form.

When a scanning pulse shown in FIG. 4 ($a_{11}$) is outputted from the output terminal $t_{11}$ of the scanning pulse generating circuit section 11, all the grids $5_1$ to $5_{10}$ of the luminescent display tube 10 are given grid driving signals while the above scanning pulse is present. Therefore, the numeric read sections 7 are driven to luminesce during this time to facilitate reading of the length of the segment anodes driven to luminesce.

After the above-mentioned operations, the first scanning pulse shown in FIG. 4 ($a_1$) is again given to the output terminal $t_1$ of the scanning pulse generating circuit section 11, and then the above-mentioned operations are repeated so that the segment anodes arranged along a predetermined direction in the luminescent display tube 10 are driven to luminesce by a length corresponding to the inputted numeric signal, and as a result the analog display of the information input can be performed.

Figure 3:
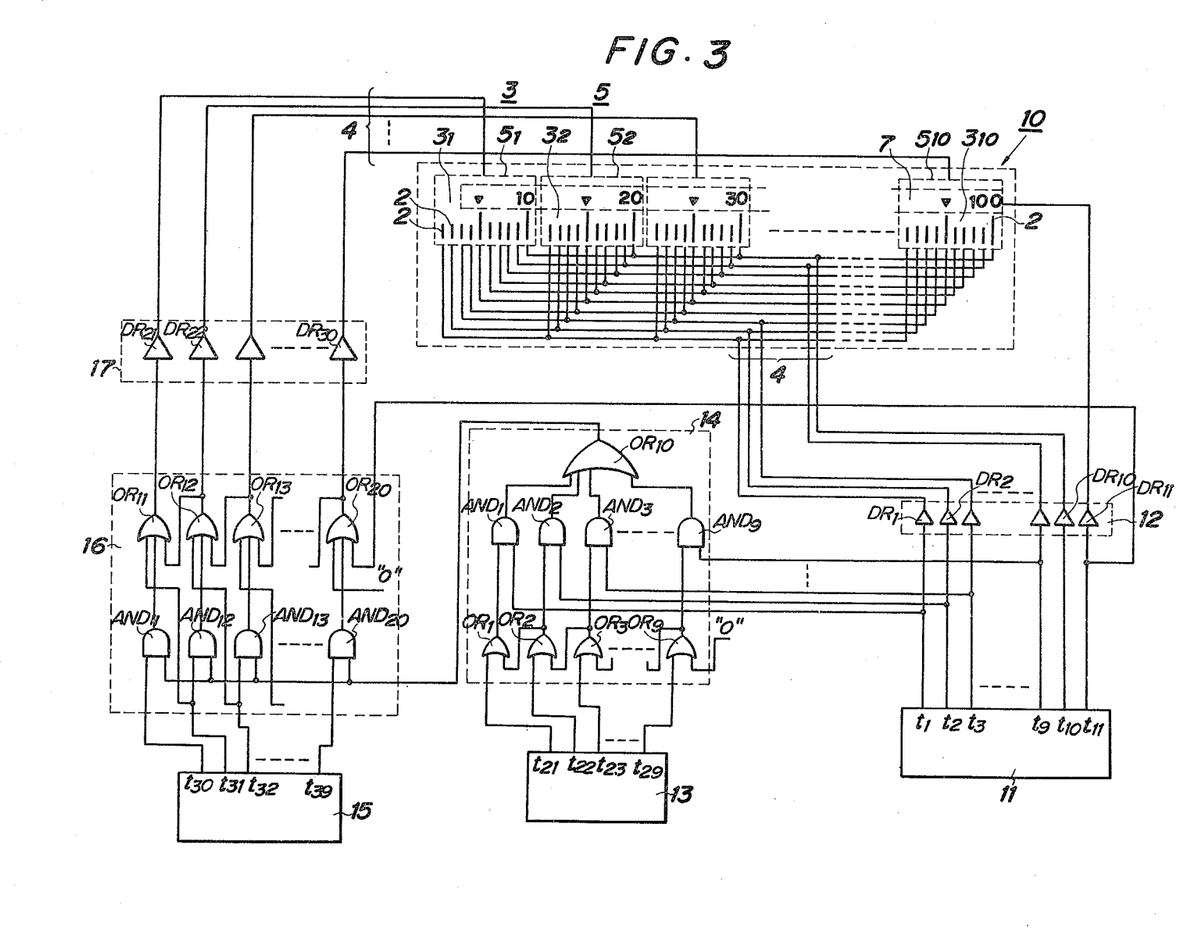
FIG. 3 is a circuit diagram of the driving circuit according to a preferred embodiment of the present invention.

In this case, the duty factor of each segment anode 2 is determined by the number obtained by adding the number of segment anodes forming each group 3 ($3_1$, $3_2$, ... ) to the number of pulses which drive the numeric read sections 7, and assumes 1/11 in the example shown in FIG. 3.

When it is not necessary to display the numeric read sections 7 or when the numeric read sections are provided by other known means, scanning pulses for driving the numeric read sections 7 become unnecessary. Therefore, the duty factor of the segment anode 2 is determined by only the number of segment anodes forming each group, and assumes 1/10 in the example shown in FIG. 3.

In other words, the duty factor for the display is independent of the number of the groups 3 ($3_1$, $3_2$, ... ), and depends on the number of segment anodes 2 forming each of the groups 3 ($3_1$, $3_2$, ... ).

Accordingly, the duty factor mentioned above may be kept constant, even if the total number of the segment anodes and accordingly the number of the groups 3 is increased in order to increase the amount of display or to improve the reading accuracy.

Thus, a large duty factor may be obtained even if the number of the groups 3 for the display is increased, and thereby the following effects are obtained:

In a luminescent display tube, the luminance of display is generally proportional to the average electric power given to the segment anodes. Accordingly, when the segment anodes are driven by pulses, a reduced duty factor makes it necessary to increase the peak value of the voltage given to the segment anodes and to provide a power supply for giving a high voltage to the segment anodes, in order to keep the above average electric power at a constant level.

According to the driving circuit of the present invention, the above duty factor can be kept large and constant irrespective of the number of the groups 3 ($3_1$, $3_2$, ... ). Therefore, low-voltage driving becomes possible and a special power source for generating a high voltage is not required, Thus, the power device or circuit for driving may be formed very easily.

The luminescent display tube driven by the driving circuit according to the present invention can reduce the number of external terminals irrespective of the number of the groups for display, and therefore can simplify the production processes thereof and can be produced economically.

Because of a large duty factor, flickering display can be eliminated and as a result very clear display can be obtained.

In the above-mentioned preferred embodiment shown in FIG. 3, the interval between the segment anodes 2 of the luminescent display tube 10 corresponds to the decimal "1", and each group 3 is made up of ten segment anodes 2 corresponding to the decimal of the input signal so that analog display may be performed. Accordingly, the duty factor of each segment 2 assumes 1/10 or 1/11.

In some cases, however, a further greater duty factor becomes necessary because, for instance, the power source voltage available is low. In such cases, the duty factor may be increased by using the driving circuit according to another preferred embodiment of the present invention shown in FIG. 5.

The driving circuit according to another preferred embodiment of the present invention will be described in detail hereinafter with reference to FIG. 5 wherein the parts having the same functions as in the case of the circuit shown in FIG. 3 are designated by like reference characters.

Figure 5:
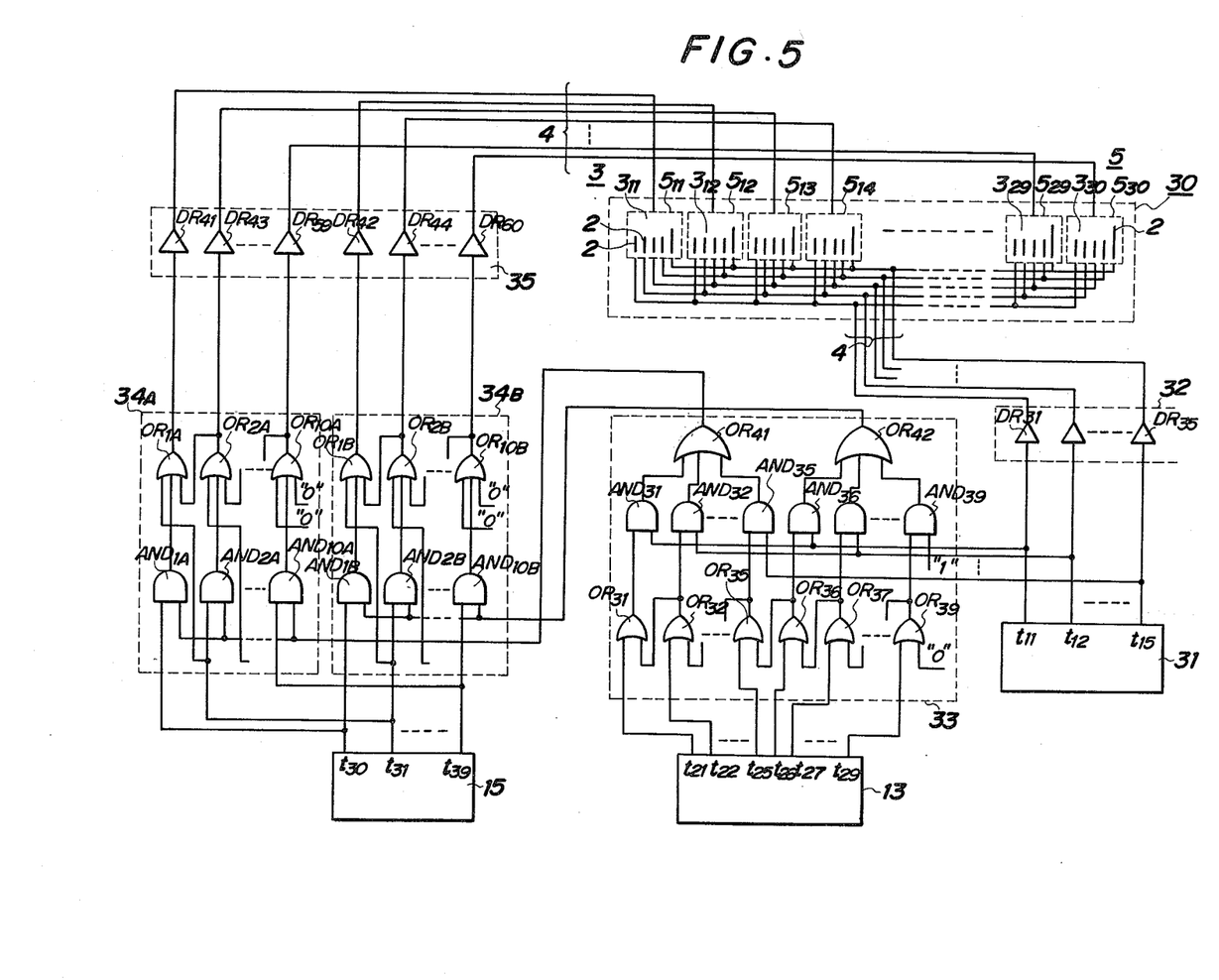
FIG. 5 is a circuit diagram of the driving circuit according to another preferred embodiment of the present invention.

In FIG. 5, a luminescent display tube 30 has groups 3 ($3_{11}, 3_{12}, \ldots, 3_{30}$) each made up of five segment anodes 2. The corresponding segment anodes 2 of the respective groups 3 ($3_{11}, 3_{12}, \ldots, 3_{30}$) are connected in common to external terminals 4.

Grids 5 ($5_{11}, 5_{12}, \ldots, 5_{30}$) corresponding to the respective groups 3 ($3_{11}, 3_{12}, \ldots, 3_{30}$) are provided, being connected to the external terminals 4 independently of one another.

With the above-mentioned construction, the luminescent display tube may be driven as follows:

The scanning pulse generating circuit section 31 gives five scanning pulses to the output terminals $t_{11}$ to $t_{15}$ cyclically and in regular succession according to the number of the segment anodes 2 forming each group 3 of the luminescent display tube 30. These scanning pulses are put in the segment-anode driving section 32 made up of driving circuits $DR_{21}$ to $DR_{35}$, where they are sufficiently amplified. The output signals of the segment-anode driving section 32 are given to the respective segment anodes 2 of the luminescent display tube 30, and thus each segment anode 2 are scanned at a duty factor of 1/5.

Meanwhile, the scanning pulses outputted from the scanning pulse generating circuit section 31 are also put in the scanning pulse selection circuitry 33.

The scanning pulse selection circuitry 33 has OR-circuits $OR_{31}$ to $OR_{39}$, AND-circuits $AND_{31}$ to $AND_{39}$, and OR-circuits $OR_{41}$ and $OR_{42}$. The OR-circuits $OR_{31}$ to $OR_{39}$ have No.1 input terminals to which connected are the respective output terminals $t_{21}$ to $t_{29}$ of the first decoder 13 to which a numeric signal for the least significant digit of the input numeric signal is given, and also have No.2 input terminals each of which is connected to the output terminal of the OR-circuit corresponding to the numeric value higher by one position. The AND-circuits $AND_{31}$ to $AND_{39}$ have No.1 input terminals connected to the outputs of the respective OR-circuits $OR_{31}$ to $OR_{39}$, and also have No.2 input terminals of which those corresponding to the numeric values "1" and "6", those corresponding to "2" and "7", those corresponding to "3" and "8", and those corresponding to "4" and "9" are connected in common, respectively, of which that corresponding to the numeric value "5" remains independent, and to which the scanning pulses from the scanning pulse generating section 31 are inputted. The OR-circuits $OR_{41}$ and $OR_{42}$ perform the OR-logic operations for the outputs of the AND-circuits $AND_{31}$ to $AND_{35}$ and AND-circuits $AND_{36}$ to $AND_{39}$, respectively.

In other words, the scanning pulse selection circuitry 33 is divided into two systems capable of selecting the scanning pulses the number of which corresponds to the number of the segment anodes forming each of the groups 3 ($3_{11}, 3_{12}, \ldots, 3_{30}$) of the luminescent display tube 30. In the respective systems, the scanning pulses are selected and synthesized according to the numeric value for the least significant digit of the input numeric signal.

When a numeric signal not larger than "5" is put in the first decoder 13, the system including the OR-circuit $OR_{41}$ selects the scanning pulses the number of which corresponds to the input numeric signal. When a numeric signal not less than "6" is put in the decoder 13, the system including the OR-circuit $OR_{41}$ and that including the OR-circuit $OR_{42}$ are both operated to select the scanning pulses the number of which depends on the input numeric signal. The sum of the numbers of the scanning pulses selected by these two systems corresponds to the above numeric value inputted.

In this embodiment, the grid-signal generating circuitry 16 shown in FIG. 3 is divided into two parts according to the scanning pulse selection circuitry 33, and therefore two grid-signal generating circuit sections 34A and 34B are provided side by side. The output of the OR-circuit $OR_{41}$ of the scanning pulse selection circuitry 33 is put in the grid-signal generating circuit section 34A, and the output of the OR-circuit $OR_{42}$ is put in the grid-signal generating circuit section 34B.

In the grid-signal generating circuit sections 34A and 34B, No.1 input terminals of the corresponding AND-circuits $AND_{1A}$ and $AND_{1B}$, $AND_{2A}$ and $AND_{2B}$, $\ldots$, $AND_{10A}$ and $AND_{10B}$ are connected in common, respectively, and are connected also to the respective output terminals $t_{30}$ to $t_{39}$ of the second decoder 15 from which the numeric signal for the higher-position digit of the input numeric signal is outputted. In addition, the outputs of the OR-circuits $OR_{1A}$ to $OR_{10A}$, to which the outputs of the AND-circuits $AND_{1A}$ to $AND_{10A}$ are given respectively, produce signals for driving the grids 5 ($5_{11}, 5_{13}, \ldots, 5_{29}$) arranged at the odd positions; the outputs of the OR-circuits $OR_{1B}$ to $OR_{10B}$, to which the outputs of the AND-circuits $AND_{1B}$ to $AND_{10B}$ are given respectively, produce signals for driving the grids 5 ($5_{12}, 5_{14}, \ldots, 5_{30}$) arranged at the even positions.

With the construction shown in FIG. 5 mentioned above, the driving circuit of the above embodiment of the present invention may be operated in the same manner as in the case of the embodiment shown in FIG. 3. DC-current level signals for grid driving are produced at the outputs of the respective OR-circuits of the grid-signal generating circuit sections 34A and 34B. The scanning pulses the number of which corresponds to the numeric value for the least significant digit of the numeric signal inputtted to the first decoder 13 are put in the above OR-circuits corresponding to the higher-position digit. Thus the grids 5 ($5_{11}, 5_{12}, \ldots, 5_{30}$) are driven through the grid driving section 35 made up of the driving circuits $DR_{41}$ to $DR_{60}$. Thus, the segment anodes the number of which corresponds to the input numeric signals given to the first and second decoders 13 and 15 are driven to luminesce so that the analog display may be performed.

In the embodiment shown in FIG. 5, each group of the luminescent display tube 30 is made up of five segment anodes 2. Therefore, the scanning pulse generating section 31 is made to generate five scanning pulses. According to these five scanning pulses, the decimal number of the least significant digit of the input numeric signal outputted from the first decoder 13 is converted into a quinary number in the scanning pulse selection circuitry 33, and are outputted through two systems. Meanwhile, the grid-signal generating circuit sections 34A and 34B receive the decimal number of the least significant digit of a higher-position numeric signal fed from the second decoder 15 and also the selected scanning pulses given through two systems from the scanning pulse selection circuitry 33 to produce signals for driving the grids 5 corresponding to the respective groups 3, the above-mentioned signals being given to the grid driving section 35.

Thus, each segment 2 of the luminescent display tube 30 is driven to luminesce at a duty factor of 1/5, and therefore low-voltage driving becomes possible.

In the embodiment shown in FIG. 5, description is made on the case where the input numeric signal is outputted from the first and second decoders 13 and 15 after converted into a decimal number. If, for instance, the first and second decoders 13 and 15 are of the type in which the input numeric signal given in the form of the binary-coded decimal code is directly converted into a quinary number, the driving circuit having the same construction as that shown in FIG. 3 may drive the luminescent display tube 30 shown in FIG. 5 in which each group 3 is made up of five segment anodes 2.

In the embodiment shown in FIG. 5, numeric read sections having numerical characters, marks or the like covered with luminescent material layers may be provided in the vicinity of the last segment anodes of the respective groups 3 as in the case of the embodiment shown in FIG. 3. In this case, scanning pulses for reading the numeric read section may be outputted from the scanning pulse generating circuit section 31 so that the numeric read sections are driven to luminesce at the last stage of a display cycle. The duty factor of each segment anode is 1/6 in this case.

In addition, the numeric read sections 7 shown in FIG. 3 may be divided into sections corresponding to the respective groups 3, and the first segment anodes of the respective groups 3 may be electrically connected in common. In the groups 3 to which grid-driving signals are given from the grid driving section 17, in this case, the numeric read sections 7 are driven to luminesce in response to the first scanning pulse.

In the above case, therefore, it is not necessary to generate scanning pulses for the numeric read sections from the scanning pulse generating section 11. Accordingly, the numeric read sections 7 can be driven to luminesce without decreasing the duty factor of each segment anode 2.

In the above embodiments, analog display may be performed up to the numeric value "100". However, analog display of any desired numeric value may be performed by increasing the capacity of the second decoder 15 to which the higher-position digit of the numeric signal is inputted and accordingly by increasing the numbers of the AND-circuits and OR-circuits of the grid-signal generating circuitry 16, in the embodiments shown in FIGS. 3 and 5.

It will be understood from the foregoing description that the driving circuit of the present invention has the following features and effects:

The luminescent display tube driven by the driving circuit of the present invention has a plurality of segment-anode groups each having the same number of segment anodes, the corresponding segment anodes of the respective groups being connected in common to external terminals, and grids provided for the respective groups electrically independently of one another. When the above luminescent display tube is driven by the driving circuit of the present invention, the above segment anodes are driven by scanning pulses cyclically and in regular succession, while the grids of the respective groups are driven statically according to the input numeric signal to be analogically displayed.

Accordingly, the duty factor of each segment anode is kept constant irrespective of the number of the anode segment groups of the luminescent display tube.

In other words, when the numbers of segment anodes and groups are increased in order to increase the amount of display or to improve the accuracy of display reading, the duty factor of each segment anode may be set at a high level and therefore low-voltage driving becomes possible.

Accordingly, the driving circuit of the present invention may be used even when only a low-voltage power source device can be obtained, and therefore the number of its applications is greatly increased. Besides, the power source device or circuit can be simplified and therefore becomes easy to produce.

Besides, in the luminescent display tube driven by the driving circuit of the present invention, the increase in the number of external terminals may be minimized even when the number of groups for display is increased. Thus the production process of the luminescent display tube can be greatly simplified.

Moreover, the duty factor of each segment anode of the luminescent display tube can be set at a high level, and therefore a very high-quality display without flickering can be obtained.

Obviously many modifications and variations of the present invention are possible in the light of the above teachings. It is therefore to be understood that within the scope of the appended claims the invention may be practiced otherwise than as specifically described.

What is claimed as new and desired to be secured by Letters Patent of the United States is:

1. A driving circuit for a luminescent display tube for analog display, said luminescent display tube at least a plurality of segment anodes arranged in a predetermined direction and each provided with a luminescent material layer adapted to luminesce when bombarded with thermions, said segment anodes being divided into a plurality of groups each having the same number of said segment anodes, the corresponding segment anodes of the respective groups being connected in common, and a plurality of control grids provided separately for the respective groups, the driving circuit comprising:

a scanning pulse generating circuit section for generating scanning pulses for successively driving said segment anodes connected in common; and a control circuit section adapted to receive said scanning pulses from said scanning pulse generating circuit section and inputted numeric signals and adapted to give driving signals to said control grids provided for the respective groups according to said input numeric signals, whereby the ratio of the duration of luminescence of each segment to the scanning period of the control grids can be kept constant even if the total number of groups of said segment anodes is increased.

2. The driving circuit recited in claim 1 wherein said control circuit section includes:

a scanning pulse selection circuit section for receiving the scanning pulses outputted from said scanning pulse generating circuit section and for selecting and synthesizing the scanning pulses corresponding in number to a numeric value for the least significant digit of the input numeric signals, and a grid-signal generating circuit section for receiving at least a numeric signal for the higher-position digit of the input numeric signals and the output signals of said scanning pulse selection circuit section for forming control signals corresponding in number to the numeric value of said higher-position digit, and for giving said control signals and output signals of said scanning pulse selection circuit section to the corresponding control grids respectively.

3. The driving circuit as set forth in claim 2, wherein: each of said scanning pulse selection circuit section and grid-signal generating section has a conversion circuit for coding the input numeric signal according to the number of the segment anodes of each group.

4. The driving circuit as set forth in claim 1, wherein: said scanning pulse generating circuit section is adapted to generate pulses for successively driving said segment anodes of said luminescent display tube and pulses for driving display sections except said segment anodes and for driving said control girds by being fed to said grid-signal generating circuit section of said control circuit section.

5. The driving circuit as set forth in claim 2, wherein: said scanning pulse selection circuit section is divided into two systems each adapted to select scanning pulses the number of which corresponds to the number of the segment anodes of each group, and the sum of the numbers of the scanning pulses selected by said respective systems is adapted to correspond to the numeric value for the least significant digit of the input numeric signal.

* * * * *